United States Patent
Fjelstad

(10) Patent No.: US 6,906,422 B2
(45) Date of Patent: Jun. 14, 2005

(54) MICROELECTRONIC ELEMENTS WITH DEFORMABLE LEADS

(75) Inventor: Joseph Fjelstad, Sunnyvale, CA (US)

(73) Assignee: Tessera, Inc., San Jose, CA (US)

(*) Notice: Subject to any disclaimer, the term of this patent is extended or adjusted under 35 U.S.C. 154(b) by 241 days.

(21) Appl. No.: 09/785,104

(22) Filed: Feb. 16, 2001

(65) Prior Publication Data

US 2001/0009305 A1 Jul. 26, 2001

Related U.S. Application Data

(62) Division of application No. 09/428,158, filed on Oct. 27, 1999, now Pat. No. 6,221,750.
(60) Provisional application No. 60/106,055, filed on Oct. 28, 1998.

(51) Int. Cl.⁷ .............................................. H01L 23/48
(52) U.S. Cl. ...................................... 257/773; 257/734
(58) Field of Search ............................ 257/734, 770, 257/771, 772, 773–779, 789

(56) References Cited

U.S. PATENT DOCUMENTS

| | | | |
|---|---|---|---|
| 3,747,202 A | * 7/1973 | Jordan | |
| 3,825,353 A | 7/1974 | Loro | 317/234 |
| 3,925,880 A | 12/1975 | Rosvold | 438/461 |
| 3,952,404 A | 4/1976 | Matunami | 29/589 |
| 4,700,473 A | 10/1987 | Freyman et al. | 29/846 |
| 4,893,172 A | * 1/1990 | Matsumoto et al. | |
| 5,053,922 A | 10/1991 | Matta et al. | 361/386 |
| 5,086,337 A | 2/1992 | Noro et al. | |
| 5,110,762 A | * 5/1992 | Nakahara et al. | |
| 5,148,265 A | 9/1992 | Khandros et al. | 357/80 |
| 5,148,266 A | * 9/1992 | Khandros et al. | |
| 5,250,847 A | 10/1993 | Baskett | 257/773 |
| 5,262,000 A | 11/1993 | Welbourn et al. | 216/2 |
| RE35,119 E | 12/1995 | Blonder et al. | 257/739 |
| 5,518,964 A | 5/1996 | DiStefano et al. | 437/209 |
| 5,639,385 A | * 6/1997 | McCormick | |
| 5,656,830 A | * 8/1997 | Zechman | |
| 5,772,451 A | * 6/1998 | Dozier, II et al. | |
| 5,830,782 A | * 11/1998 | Smith et al. | |
| 6,179,472 B1 | * 1/2001 | Gilliland et al. | |
| 6,221,749 B1 | * 4/2001 | Kirloskar et al. | |
| 6,361,959 B1 | 3/2002 | Beroz et al. | |
| 6,482,013 B2 | * 11/2002 | Eldridge et al. | |

FOREIGN PATENT DOCUMENTS

| | | |
|---|---|---|
| EP | 0352020 | 1/1990 |
| JP | 57-121255 | 7/1982 |
| JP | 57121255 A * | 7/1982 |
| WO | WO 99/40761 | 8/1999 |

* cited by examiner

Primary Examiner—Nathan J. Flynn
Assistant Examiner—Kevin Quinto
(74) Attorney, Agent, or Firm—Lerner, David, Littenberg Krumholz & Mentlik, LLP

(57) ABSTRACT

An element such as a semiconductor wafer or other body is provided with flexible leads, the tip ends of which project over the front surface of the element. The tips of the flexible leads are spaced apart from the front surface and are independently moveable with respect to the element. The flexible leads may be curved in a plane parallel to the front surface of the element, or may be curved so that the tip end of each flexible lead is disposed further from the front surface of the element than the main body of the flexible lead.

9 Claims, 7 Drawing Sheets

MICROELECTRONIC ELEMENTS WITH DEFORMABLE LEADS

CROSS-REFERENCE TO RELATED APPLICATIONS

The present application is a divisional of U.S. patent application No. 09/428,158 filed on Oct. 27, 1999, now U.S. Pat. Ser. No. 6,221,750, issued Apr. 24, 2001. The present application claims benefit of U.S. Provisional Patent Application No. 60/106,055, filed Oct. 28, 1998, the disclosure of which is incorporated by reference herein.

BACKGROUND OF THE INVENTION

The present invention relates to fabrication of leads on microelectronic elements such as semiconductor wafers and chips and to microelectronic elements having such leads thereon.

Microelectronic elements such as semiconductor chips typically are formed as solid elements with contacts on a front face. For example, semiconductor chips are typically formed by processing a large, flat disk-like wafer to form the internal electronic components of numerous semiconductor chips, the elements of each of such chip being disposed within a small, typically rectangular region of the wafer. The pads in each region are connected to the internal electronic components in that region. Typically, a passivation layer is applied on the front surface of the layer and provided with openings aligned with the pads. The passivation layer protects the internal components of the layer from contamination. After the wafer has been processed, the wafer is cut so as to separate the regions from one another to yield individual semiconductor chips.

Individual semiconductor chips can be mounted directly to a circuit board or other substrate by solder-bonding the contact pads of the chip directly to the circuit board, a process commonly referred to as "flip-chip" interconnection. However, such connections suffer from significant drawbacks including difficulties in testing chips before they are assembled to the circuit board and failure of the solder bonds due to stresses caused by thermal expansion and contraction of the components during manufacture and use. To avoid these difficulties, semiconductor chips have been mounted to circuit boards heretofore by wire-bonding. In wire-bonding, the chip is mounted face-up, with the contact bearing front face of the chip facing upwardly, away from the circuit board. Small wires are connected between individual contacts on the chip and the corresponding connections on the circuit board. As described, for example, in Matunami, U.S. Pat. No. 3,952,404 and Luro, U.S. Pat. No. 3,825,353, it has been proposed to provide leads on chips connected to the contact pads of the chips. The leads may be subsequently bonded to a circuit board or other substrate.

Other approaches to handling and mounting semiconductor chips include mounting the chips in packages having exposed terminals connected to the chip contacts and bonding the terminals of the packages to the circuit board. Numerous designs for chip packages have been proposed. Many of these involve packages structures which are considerably larger than the chips themselves. Moreover, some chip packages provide do not provide electrical connections with adequate reliability. As disclosed in the preferred embodiments of commonly assigned U.S. Pat. Nos. 5,148,265; 5,148,266; and 5,518,964, the disclosures of which are hereby incorporated by reference herein, as well as other commonly assigned patents, a package semiconductor chip can be provided with terminals overlying a face of the chip and electrically connected to the contacts of the chip. Most commonly, the terminals are disposed on a supporting dielectric layer and a compliant layer such as a gel or elastomer may be disposed between the terminals and the chips as to mechanically de-couple the terminals from the chip and allow movement of the terminals with respect to the chip. Certain embodiments taught in these patents use flexible leads interconnecting the terminals and the chip. Although various fabrication methods may be employed to produce these assemblies, such assemblies most commonly are formed by fabricating the dielectric with the leads and terminals thereon and attaching the dielectric to the chips, either before or after severing the chips from the wafer. As described in co-pending, commonly assigned U.S. patent application No. 09/217,675, filed May 24, 1999, the disclosure of which is incorporated by reference herein, leads formed on the surface of a chip or wafer can be reliably interconnected with another element such as a circuit panel bearing leads.

The approaches disclosed in these commonly assigned patents and applications provide useful solutions to the problems of handling and mounting microelectronic elements such as semiconductor chips. Nonetheless, further development and additional solutions would be desirable.

SUMMARY OF THE INVENTION

One aspect of the present invention provides methods of processing a microelectronic element having a front face with a plurality of pads thereon. Methods according to this aspect of the invention desirably include providing a sacrificial layer overlying the front surface and forming leads on the sacrificial layer. Each lead typically has a pad end connected to a pad of the microelectronic element and a tip end. The sacrificial layer is then removed from beneath the leads. The sacrificial layer may be entirely removed from beneath the leads, so as to leave the lead tip ends independently movable with respect to the pads and the microelectronic element. That is, each lead can be flexed independently. Alternatively, the step of removing the sacrificial layer may be performed so to only partially remove the sacrificial layer and leave portions of the sacrificial layer beneath the tip ends of the leads releasably connecting the tip ends with the front face of the microelectronic element. As further discussed below, such releasably connected leads can be subjected to further processing which breaks the releasable connections, leaving the tips ends movable with respect to the pads and microelectronic elements. The step of forming the sacrificial layer may include forming apertures in the sacrificial layer in alignment with the pads on the microelectronic element, whereas the step of forming the leads may include the step of depositing one or more conductive materials onto the sacrificial layer so that the deposited conductive material contacts the pads at the apertures. The depositing step may be performed, for example, by plating or sputtering the conductive materials.

According to certain embodiments of the invention, the step of providing the sacrificial layer may be performed so as to form the sacrificial layer with regions of different thicknesses including thin regions and thick regions, and the leads may be formed so that they extend over both the thick regions and the thin regions. Thus, leads include sections disposed near to the front surface and sections disposed from the front surface. Most preferably, the sections remote from the front surface include the tip ends of the lead. The sacrificial layer with thin and thick regions may be formed by applying a first sub-layer on the front surface of the microelectronic element and applying a second sub-layer over the first sub-layer and selectively patterning the sub-layer, as by selectively applying the second sub-layer or, more preferably, by non-selectively applying the second sub-layer and selectively removing portions of the second sub-layer and leading other portions.

Yet another aspect of the present invention provides microelectronic elements including a body defining a front surface, the body having electrical contact pads exposed at the front surface. Flexible leads connected to the pads project from the pads, and at least some of the leads project over the front surface of the body. The leads are spaced apart from the front surface at least adjacent to tip ends thereof. The tip ends of the leads desirably are removable with respect to the body and independently movable with respect to one another. The body may be a semiconductor body such as a chip or a wafer incorporating a plurality of semiconductor chips. In this case, at least some of the leads associated with each chip desirably extend over the front face of such chip. Alternatively, the body may be a connecting substrate such as a wafer probe card. As further discussed below, the leads may form the wafer-engaging probes of a wafer probe card.

These and other objects, features and advantages of the present invention will be more readily apparent from the detailed description of the preferred embodiments set forth below, taken in conjunction with the accompanying drawings.

DETAILED DESCRIPTION

Figure 1A:
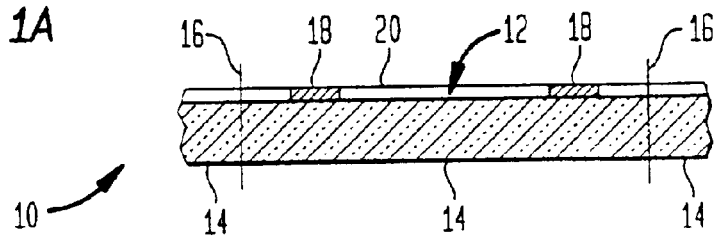
FIG. 1A is a fragmentary diagrammatic sectional view depicting portions of a wafer during a process in accordance with one embodiment of the invention.

A small portion of a typical semiconductor wafer is depicted in FIG. 1A. The wafer includes a unitary semiconductor body 10 having a front face 12 incorporating numerous regions 14. The boundaries between regions are indicated by border lines 16 in FIG. 1A. Each region 14 incorporates internal electronic components (not shown) and contact pads 18 on the front face. Most commonly, the contact pads are formed from aluminum. The wafer typically incorporates a passivation layer 20 such as a polymer or an inorganic dielectric overlying the front surface. The passivation layer has openings aligned with pads 18.

Figure 1B:
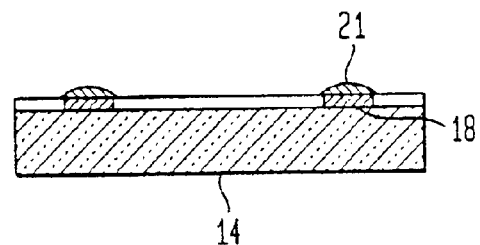
FIGS. 1B through 1K are views similar to FIG. 1A but depicting portions of the wafer at later stages during the process.
Figure 1C:
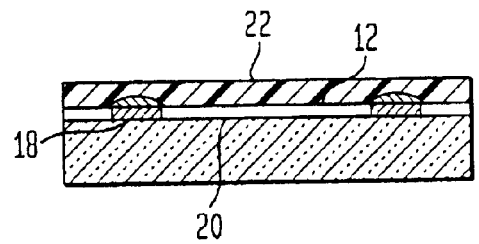
Figure 1D:
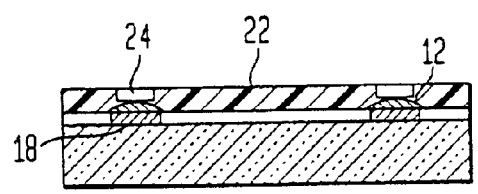
Figure 1E:
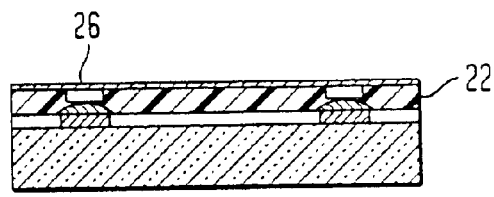

In a process according to one embodiment of the invention, pads 18 may be covered by cover metal such as nickel and gold, applied by processes such as electroless plating or sputtering. These layers form a metal deposit 21 (FIG. 1B) on each contact pad 18. The metal deposit forms part of the contact pad, and provides a surface which will form a reliable interface with the metals applied during subsequent stages. Although only a single region corresponding to a single semiconductor chip 14 is depicted in each of FIGS. 1B through 1K, it should be appreciated that these steps are performed while regions 14 remain part of the unitary wafer, so that numerous chips are processed simultaneously.

In the next stage of the process, a polymer such as a photo-imagable resist is applied over the front face 12 of the body to form a additional layer 22 (FIG. 1C) covering the front face and hence overlying the passivation layer 20 and contacts 18. Layer 22 is selectively treated so as to form apertures 24 (FIG. 1D) is alignment with pads 18 and extending through layer 22 to the exposed surfaces of metal deposits 21. For example, where polymer 22 is a photo-imagable polymer such as those commonly used as resists, layer 22 can be applied and treated with pattern-wise exposure to light or other electromagnetic radiation so as to cure the polymer only in those areas which are not aligned with pads 18. The uncured polymer is then washed away, leaving the pads 18 exposed. Alternatively, the layer may be applied and cured and then selectively ablated or, preferably, selectively etched so as to remove portions of the layer overlying pads 18.

Figure 1F:
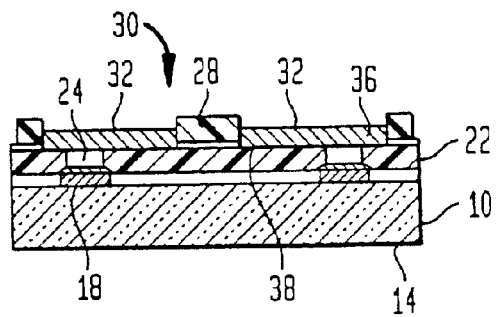
Figure 1G:
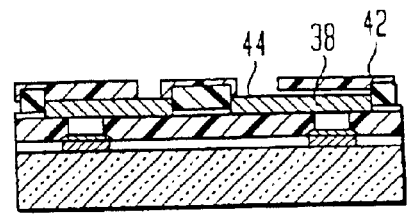
Figure 1H:
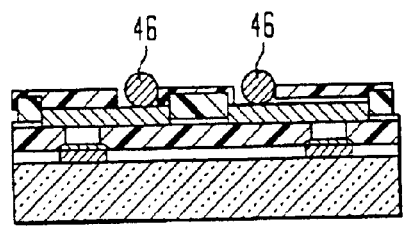
Figure 1I:
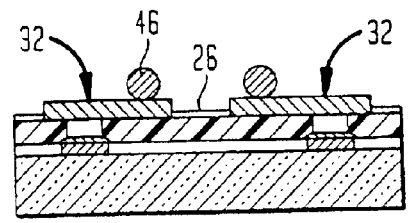
Figure 1J:
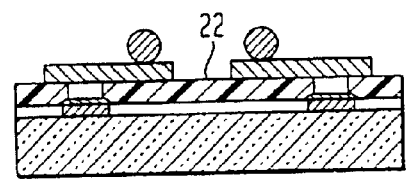
Figure 1K:
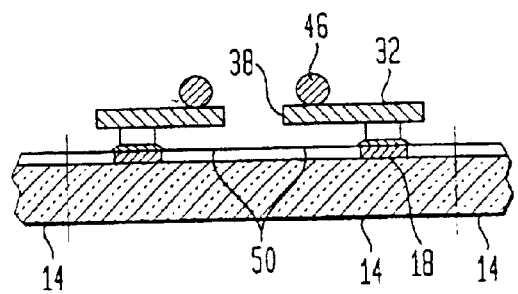

In the next stage of the process (FIG. 1E), a thin strike layer 26 of a conductive material such as copper is deposited onto the exposed surface of layer 22, by a process such as sputtering or electroless plating. Then a conventional photoresist 28 (FIG. 1F) is applied and patterned selectively, using conventional methods so as to leave openings 30 in regions where the leads are to be formed. Layer 28 may be patterned by photographic methods, as, for example, where the photoresist is selectively cured by exposure to pattern-wise illumination and developed so as to remove uncured resist. Openings 30 extend over openings 24 in layer 22. One or more conductive materials are applied into openings 30 so as to form leads 32 connected to contact pads 18 at openings 24. Thus, each lead has a pad end 36 connected to the contact pad and a tip end 38 remote from the pad end of the lead. The metal deposited to form leads 32 may include metals such as copper, gold, nickel and combinations and alloys thereof. The leads may incorporate multiple layers of metals having different compositions as, for example, a layer of a relatively stiff metal such as nickel, a layer of a highly conductive metal such as copper or gold, and another layer of the relatively stiff metal. Superelastic or "shape memory" alloys such as Nitinol™ can also be used. The metal may be deposited into openings 30 by electroplating using the thin strike layer 26 (FIG. 1E) to convey the plating current. Alternatively or additionally, metal may be deposited by techniques such as sputtering, chemical vapor deposition, evaporative coating or other conventional deposition techniques. Strike layer 26 may be omitted where this technique is used. Each lead includes an elongated main section 40 (FIG. 2) extending between the pad end 36 and the tip end 38 of the lead. Each main section is generally in the form of an elongated strip having oppositely directed major surfaces. Thus, one major surface faces upwardly, away from body 10 (to the top of the drawing as seen in FIG. 1F) whereas the opposite major surface faces downwardly, towards the body 10. The directions upwardly and downwardly as used in this disclosure refer to directions relative to body 10 and not to directions in the normal, gravitational frame of reference. Other directions such as horizontal and vertical are also given herein in the frame of reference of the semiconductor body.

Following formation of the leads, a further photoresist layer 42 (FIG. 1G) is applied and selectively patterned by conventional means so as to provide openings 44 at the tip ends 38 of the leads. A bonding material such a solder 36 (FIG. 1H) is applied in openings 44 and provides masses of bonding material at the tip ends of the leads. Other bonding materials such as eutectic bonding alloys, diffusion bonding alloys, conductive polymers and the like may be employed in place of solder.

Following deposition of the bonding material, the second resist 42 is removed, thereby exposing strike layer 26. The strike layer is removed by a brief etching or reverse electroplating process which leaves leads 32 and bonding material 46 substantially unaffected, thus bringing the assembly to the condition illustrated in FIG. 1J, with sacrificial layer 22 exposed. Sacrificial layer 22 is then removed by a process which does not substantially attack leads 32 or bonding material 46. For example, the polymer layer can be removed by exposure to a gaseous etchant as described in co-pending more commonly assigned U.S. patent application No. 09/020,750, filed Feb. 9, 1998, the disclosure of which is hereby incorporated by reference herein. In the particular process illustrated in FIGS. 1J and 1K, the etching process is allowed to proceed until the sacrificial layer 22 is entirely removed by the gaseous etchant. Liquid etchants and solvents which attack the particular polymer employed in layer 22 may be employed in place of a gaseous etchant. Removal of the sacrificial layer 22 brings the wafer to the condition illustrated in FIG. 1K. As best seen in that figure, the wafer includes a plurality of regions 14, each constituting a single semiconductor chip. The particular chips illustrated in FIG. 1K have contacts 18 disposed at a peripheral region of the chip and leads 32 extend inwardly from such peripheral region over a central region 50 of the chip, so that the tip end 38 and bonding material 36 of each lead are disposed over the central region.

Figure 1L:
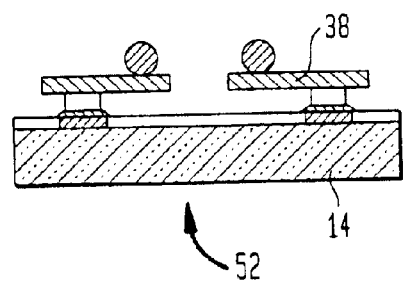
FIG. 1L is a view similar to FIG. 1A but depicting the chip cut from the wafer of FIG. 1A–1L.

The wafer is then severed to form individual units 52 (FIG. 1L) each incorporating a single semiconductor chip or a few chips and the leads 38 associated therewith.

Figure 2:
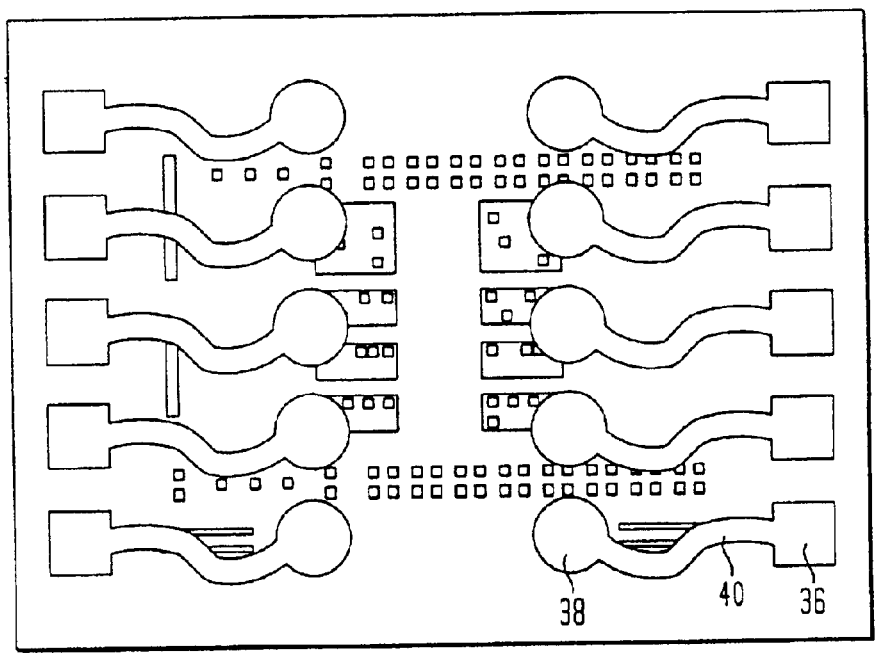
FIG. 2 is a diagrammatic top view of the chip depicted in FIG. 1L.
Figure 3:
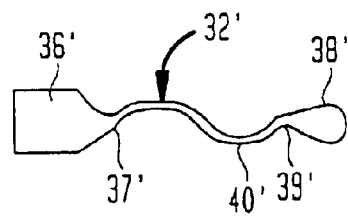
FIG. 3 is a diagrammatic top view depicting a lead utilized in accordance with a further embodiment of the invention.

Leads 38 are free to deform independently of one another. The tip ends 38 of the leads are not physically connected to one another, so that the tip ends of the leads can move relative to one another and relative to the chip 14. The leads are curved in a plane parallel to the front face of the chips as seen in FIG. 2. In the particular arrangement shown in FIG. 2, the main portion 40 of each lead has width or horizontal dimension w transverse to its direction of elongation smaller than the corresponding dimensions of pad end 36 and tip end 38. As depicted in FIG. 3, each lead 32' may have gradually tapering sections 37 and 39 connecting the main portion 40' with the pad end 36' and with the tip end 38', respectively. This arrangement minimizes stress concentrations in the lead and thus provides a more fatigue-resistant lead. Other configurations of curved leads are taught in U.S. Pat. No. 5,821,608, the disclosure of which is hereby incorporated by reference herein. The curvature of the leads facilitates flexing of the leads in directions parallel to the chip face.

The leads redistribute the chip contacts. That is, the tip end of each lead is disposed at a location different from the location of the contact pad associated with that particular lead. The particular redistribution pattern shown in the drawings is merely illustrative; the tips can be disposed at any desired locations on the chip. Also, the tips ends of leads connected to some pads can be adjacent other pads. The entire lead pattern for each chip may be disposed within the area of the chip, and particularly within the area bounded by the contact pads. The process can be practiced using wafers designed for conventional mounting procedures; there is no need to provide additional space between chips in the form of wide saw lanes or other special expedients to accommodate the process.

Figure 7:
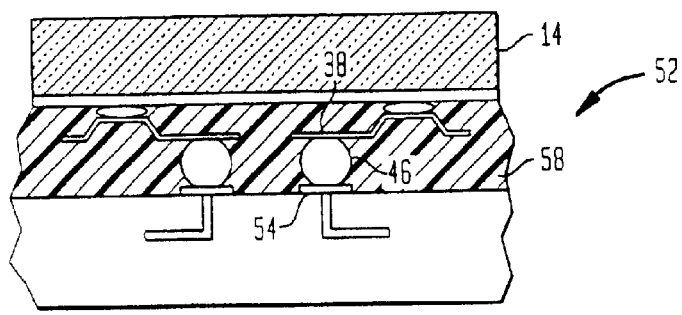
FIG. 7 is a fragmentary, diagrammatic sectional view depicting the chip of FIGS. 1A–1L mounted on a circuit board.

In use, the chip formed by the process of FIGS. 1A–1L can be juxtaposed with a circuit panel 52 (FIG. 7) or other connection component having contacts 54 thereon. The tips 38 of the leads are bonded to the contacts on the circuit panel using the bonding material 46 on the tips. Flexure of the leads allows compensation for differential thermal expansion and contraction in service and in fabrication. If the bonding material is provided on the contacts of the circuit panel, it need not be provided on the tips of the leads. An encapsulant 58, preferably a compliant material such as a gel or elastomer, may be provided as an underfill between the leads and the front surface of the chip. The underfill may be provided as a coating or layer overlying the chip before bonding the lead tips to the connection component so that the underfill protects the chip during handling. Alternatively, the underfill may be applied after bonding of the leads to the connection component.

Figure 8:
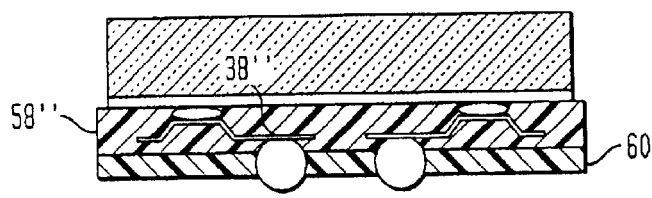
FIG. 8 is a diagrammatic sectional view depicting a packaged semiconductor chip according to a further embodiment of the invention.

In yet another variant, one or more additional layers can be provided over the leads as, for example, a protective layer such as a flexible polymeric layer 60 having vias aligned with the lead tips 38" (FIG. 8). An encapsulant 58" may be provided between the chip surface and this protective layer. The protective layer and encapsulant desirably are applied before the wafer is severed into individual chips. In the particular embodiment depicted in FIG. 8, the bonding material on the lead tips projects through the vias. However, the vias in the protective layer can be provided with electrically conductive via liners. Also, the protective layer can be provided with additionally electrically conductive components such as electrically conductive traces which are connected to the lead tips for redistributing signals along the protective layer; additional terminals for connection to external devices ground or power planes. The protective layer may be a multi-layer structure. The packaged chip with the protective layer and encapsulant can be handled and placed onto a circuit board as a unit using standard surface mount techniques.

Figure 4A:
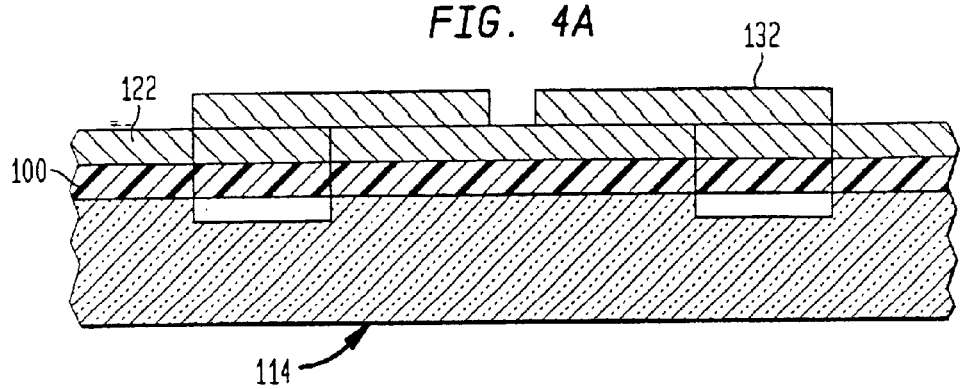
FIG. 4A is a fragmentary, diagrammatic sectional view depicting portions of the wafer during a process in accordance of yet another embodiment of the invention.
Figure 4B:
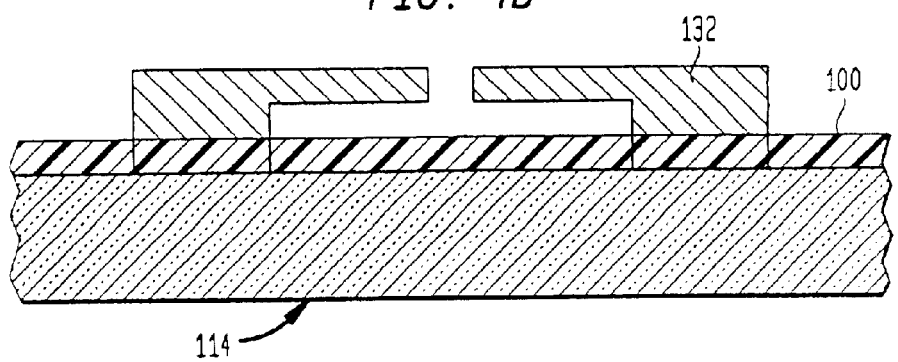
FIG. 4B is a view similar to FIG. 4a but depicting the wafer at a later stage in the process.

In a variant of the process, a polymer layer 100 (FIG. 4A) or other protective layer is applied on the surface of the wafer and remains on the surface in the final product. An additional sacrificial layer 122 is applied over the polymer layer and used to support the leads 132 during lead formation. After the leads are formed, this additional sacrificial layer is removed, bringing the assembly to the condition illustrated in FIG. 4B. The additional sacrificial layer may include, for example, aluminum which can be removed by a caustic etch solution leaving the leads intact or a further polymer having a composition different from the polymer used for the polymer layer 100. In a further variant, a relatively thick, unitary polymer layer can serve the functions of both the sacrificial layer and the polymer layer. The etching process used to remove the polymer layer is controlled so as to etch only part way through the polymer layer, leaving a portion of the polymer layer intact on the chip surface, but removing a top portion of the polymer layer close to the level of the leads.

Figure 5:
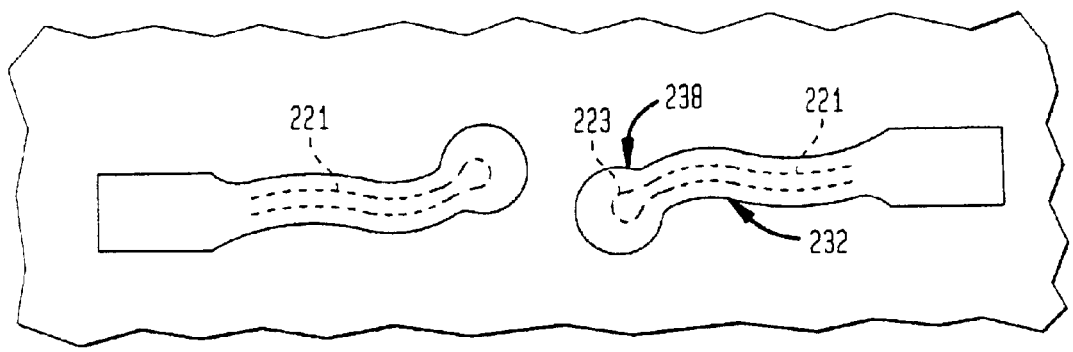
FIG. 5 is a diagrammatic top view depicting portions of a wafer of yet another embodiment of the invention.
Figure 6:
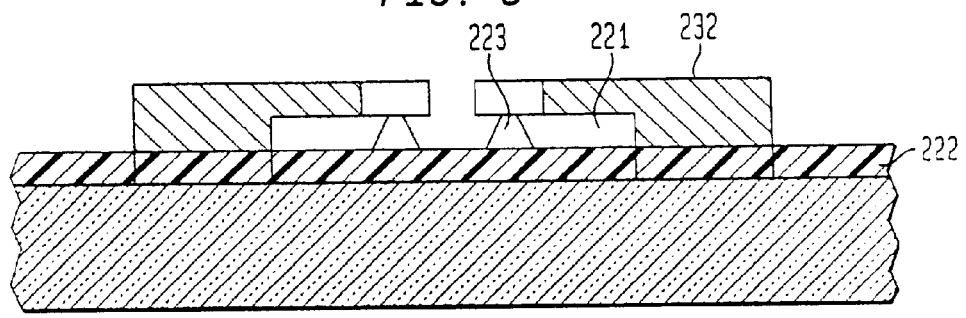
FIG. 6 is a fragmentary, diagrammatic sectional view depicting portions of a wafer according to yet a further embodiment of the invention.

As seen as top view in FIG. 5 and in sectional elevational view in FIG. 6, a process where a sacrificial layer such as a polymer layer 222 is etched away beneath the leads 232 can be conducted so that the lead itself shields the material of the sacrificial layer from the etchant. The material immediately beneath the lead is removed at a slower rate than the remaining material. If the process is stopped at the appropriate time, some of the material in the layer remains beneath the lead while forming a fine, frangible web 221 beneath the lead. Also, where the lead has a tip 238 wider than the remainder of the lead, some of the material in the layer may be left as a frangible post 223 which releasably retains the lead tip in a position on the layer. Processes for forming releasable connections to leads by partial etching of a polymer layer are disclosed in co-pending, commonly assigned U.S. patent application No. 09/020,750, filed Feb. 9, 1998, the disclosure of which is hereby incorporated by reference herein. These releasable connections are broken during subsequent processing or mounting of the chip, or during subsequent thermal cycling of a chip and substrate combination, leaving the lead tips free to move relative to the chip. For example, after the lead tips are bonded to a circuit panel or other component, differential expansion or contraction during manufacturing operations or during use of the assembly, also referred to as "thermal mismatch", will break the releasable connection between the lead tip ends and the chip, leaving the tip ends free to move relative to the chip. Alternatively, the circuit panel or other component may be moved through a predetermined displacement away from the chip after bonding the lead tip ends to such component to break the releasable connections between the lead tip ends and the chip.

In the particular embodiments discussed above, the leads are formed on the top surface of the polymer layer by selective, additive plating. Thus, in FIG. 1F copper is plated into openings in a resist layer. These openings are provided only where the leads are to be formed. In a variant of the process, copper or another conductive metal can be applied by non-selective plating or by laminating a thin metallic sheet onto the top surface of the sacrificial layer to form a continuous layer electrically connected to the contact pads, and this continuous metal layer can then be patterned to form leads by a selective etching process.

In the embodiments discussed above, the contact pads of the chip are provided adjacent the periphery of the chip, and the leads extend inwardly from the contact pads towards the middle of the chip, in a so-called "fan-in" pattern. However, the leads may extend outwardly from the contact pads, to or beyond the periphery of the chip, in a so-called "fanout" pattern as well. Combinations of these configurations, referred to as a "fan-in/fan-out" pattern may be used. Where some or all of the leads project beyond the outboard edge of the chip, support elements may be provided alongside of the chip to support the leads, as described, for example, in U.S. Pat. No. 5,679,977, the disclosure of which is hereby incorporated by reference herein.

Figure 9A:
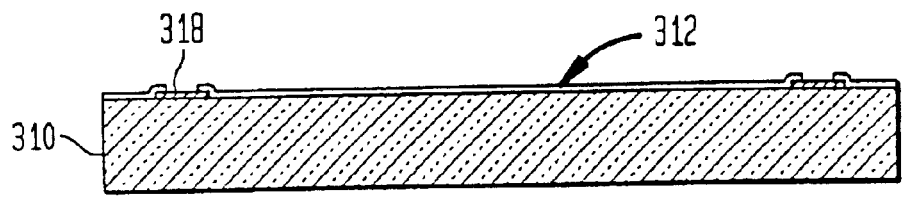
FIGS. 9A–9I are fragmentary, diagrammatic sectional views depicting portions of the wafer during progressively later stages of a process according to yet another embodiment of the invention.
Figure 9B:
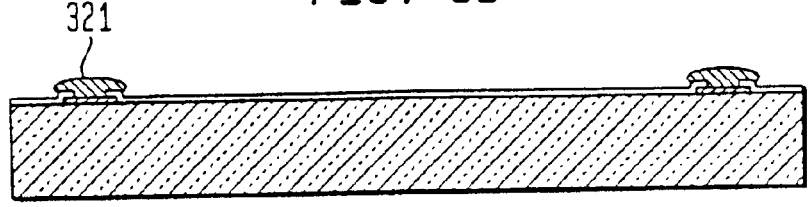
Figure 9C:
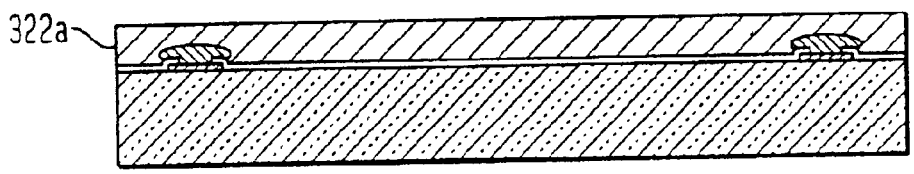
Figure 9D:
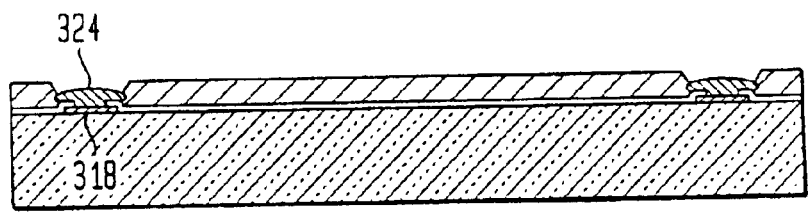
Figure 9E:
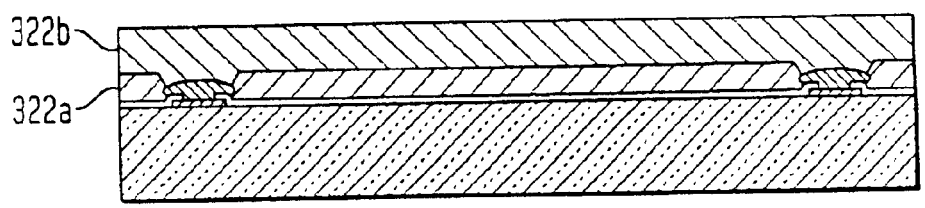
Figure 9F:
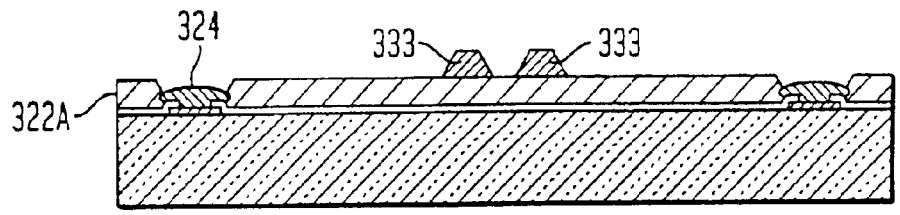
Figure 9G:
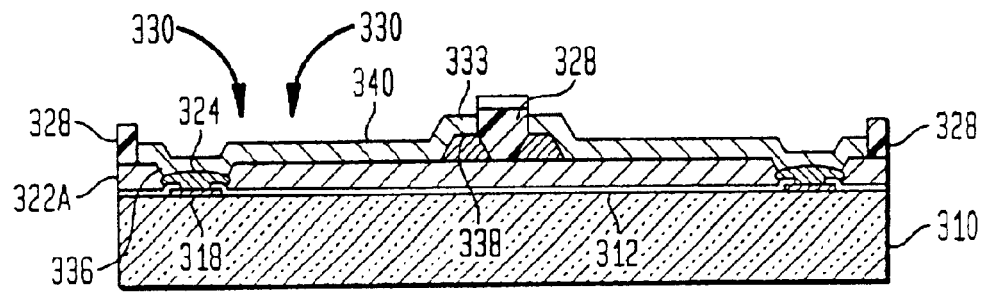
Figure 9H:
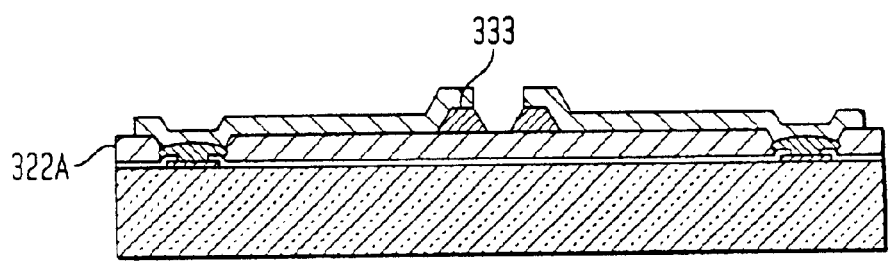

A process according to a further embodiment of the invention includes a microelectronic element such as a chip or wafer 310 (FIG. 9A) having contacts 318 exposed at its top or frontal surface 312. Although only one chip is shown in FIGS. 9A–9I, here again the process can be performed on a wafer including plural chips. The chips can be severed from one another after any portion or all of the other process steps have been performed. In the manner discussed above with reference to FIG. 1B, contacts 318 are provided with over-coating 321 of a conductive metal or metals. Next, a first sacrificial sub-layer 322A is applied and patterned in the same manner as the sacrificial layer discussed above, leaving openings 324 aligned with pads 318 (FIGS. 9C–9D). A second sub-layer 322B is then applied over the first-formed sub-layer 322A. The second sub-layer is selectively patterned so that only portions 333 of the second sub-layer remain (FIG. 9F). For example, the second sub-layer 322B may be formed from a photo-imagable material such as a curable polymer and selectively cured only in regions 333, whereupon the uncured polymer may be removed. Alternatively, portions of the second sub-layer may be removed by a selective process such as selective etching through a mask using an etchant which does not substantially attack the material of first sub-layer 322A. In yet another alternative, the second sub-layer may be selectively applied as by applying the material of a second sub-layer through a screen or mask so as to deposit the second sub-layer only in areas 333 where it is to remain.

Figure 9I:
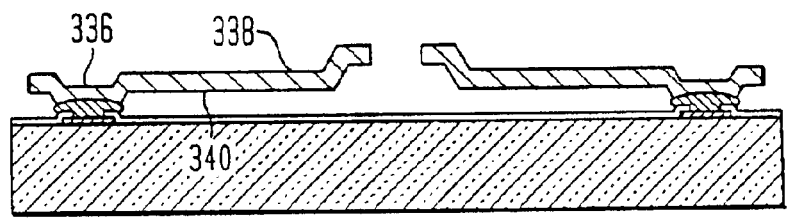

As best appreciated with reference to FIG. 9F, the pattern of the second sub-layer is selected so that the second sub-layer does not cover openings 324. The second sub-layer or region 333 together with the first sub-layer 322A forms a composite sacrificial layer having thin regions where only layer 322A is provided and thick regions where the regions 333 of the second sub-layer remain. Openings 324 extend through the thin regions of the composite sacrificial layer. A resist 328 is applied and patterned leaving openings 330 in regions where the leads are to be formed. Each opening 330 extends over one opening 334 in the thin region of the sacrificial layer, and also extends over a thick region 333 of the composite sacrificial layer. One or more metals are deposited into openings 330 in the manner discussed above so as to form leads 332 extending within the openings. Here again, each lead has a pad end 336 connected to one of the pads 318 and has a tip end 338 remote from the pad end of that lead. Here, the tip ends 338 are formed on the thick regions 333. Thus, the main portion 340 of each lead extends substantially parallel to the front surface 312 of the body whereas the tip portion 338 of the lead adjacent to tip end projects up from the main portion and hence extends away from the front face of body 310. This arrangement is also shown in FIG. 9I. Following formation of the leads, the resist 328 is removed (FIG. 9H) and the composite sacrificial layer, including the first sub-layer 322A and the remaining portions 333 of the second sub-layer is removed, leaving the assembly in the condition illustrated in FIG. 9I. The upwardly projecting portions of the leads facilitate bonding of the leads to substrates and provide additional flexibility in the leads.

Figure 10:
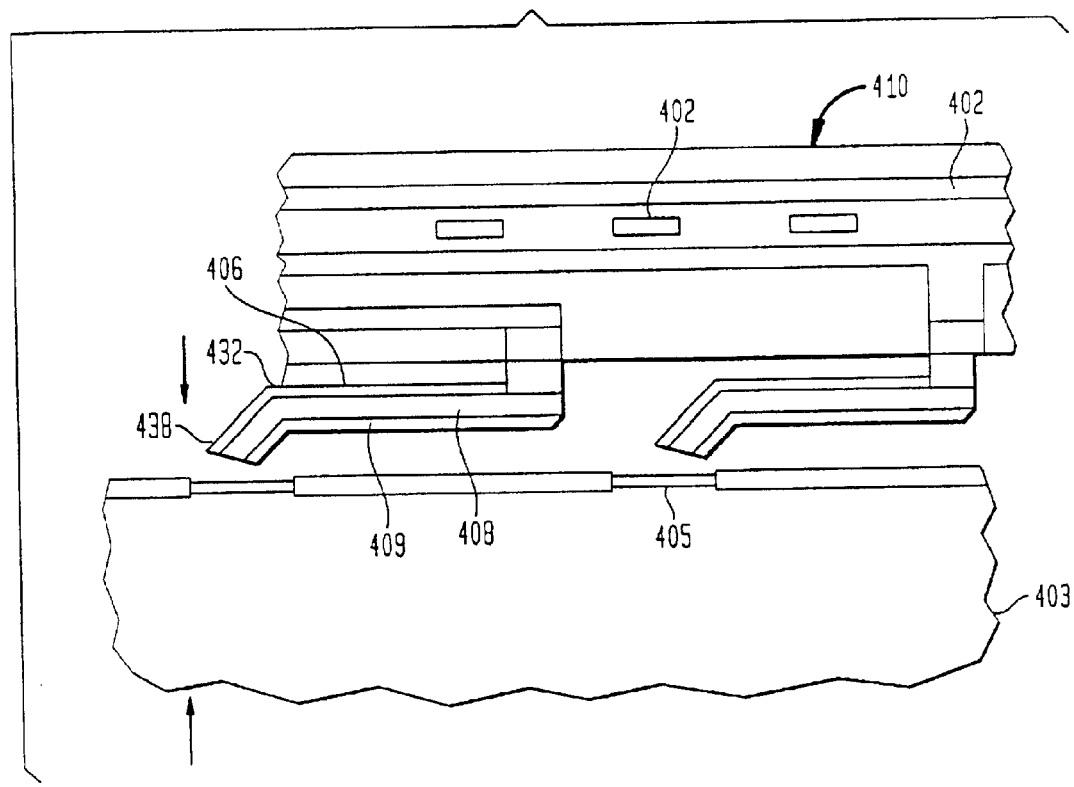
FIG. 10 is a fragmentary, diagrammatic view of a probe card according to a further embodiment of the invention.

In the embodiments discussed above, the leads are provided on a microelectronic element which are incorporates one or more active semiconductor chips. However, similar leads may be formed on other microelectronic elements. For example, as seen in FIG. 10, leads 432 are provided on a body 410 which is a wafer probe card. Such a probe card includes internal conductors 402, typically extending in various directions within the body of the probe card. The particular leads illustrated in FIG. 10 include a multi-layer structure with a layer 406 of a relatively stiff metal such as nickel on the face of the lead facing toward the body, a further layer of a highly conductive metal such as gold or copper 408 overlying layer 406 and a further layer of a stiff metal such as nickel 409 overlying layer 408. Other metals such as osmium, rhenium, rhodium, platinum, palladium and the like may be employed. Also, so-called "super-elastic alloys" or super-plastic alloys" and the alloys commonly referred to as "shape memory alloys" may be employed in forming the leads. These super-elastic and super-plastic or shape memory alloys provide particularly good fatigue-resistance in the leads. Moreover, these leads have portions 438 projecting upwardly in the frame of reference of body 410 (i.e., away from the body and towards the bottom of the drawing as seen in FIG. 10) at the tip ends of the leads.

Figure 11:
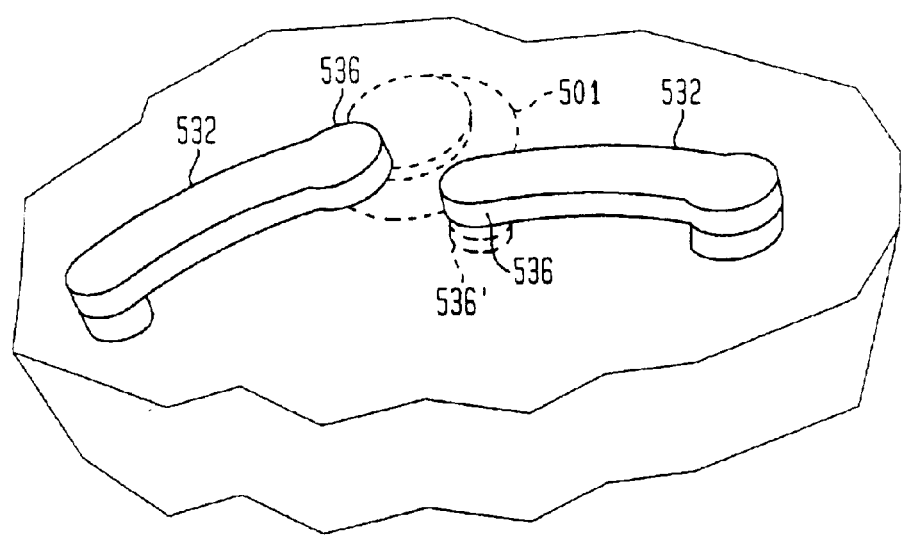
FIG. 11 is a fragmentary, perspective view of a socket according to a further embodiment of the invention.

In use, probe card 410 can be engaged with a conventional wafer 403 having contacts 405 thereon so as to engage the projecting tip ends 438 of the leads with the contacts. The projecting tip ends provide particularly good, reliable engagement at high unit pressure. Desirably, the leads are formed with corners or edges as depicted in FIG. 10, or with other suitable asperities, at the tip ends of the leads when used for this purpose. This promotes most reliable connection between the probe card and the contacts on the wafers The fabrication procedures discussed above can be employed to make sockets, including sockets of the type discussed in preferred embodiments of commonly assigned U.S. Pat. No. 5,810,609, the disclosure of which is incorporated by reference herein. Thus, as seen in FIG. 11, the leads formed according to the invention need not be used as conventional leads in typical lead connection. Thus, a socket 500 formed in accordance with a further embodiment of the invention incorporates lead structures 532 similar to the leads discussed above. Here, the lead structures are arranged in pairs or sets incorporating a plurality of leads. One such pair is depicted in FIG. 11. The leads of each such pair or set are arranged so that the tip ends 536 of the leads in the pair or set are disposed adjacent one another, but with a small gap therebetween. In use, a device bearing mating elements such as solder balls 501 is engaged with the socket so that each ball is engaged between the tip ends of the leads of one such pair. The leads of each set deflect outwardly, away from one another to the position depicted in broken lines at 536' in FIG. 11. The mating element 501 is thus securely received between the tip ends of the leads of a set.

As these and other variations and combinations of the features discussed above can be utilized without departing from the present invention as defined from the claims, the foregoing description of the preferred embodiments should be taken by way of illustration rather than by way of limitation of the invention defined by the claims.

What is claimed is:

1. A microelectronic element comprising:
   (a) a body defining a front surface, said body having pads exposed at said front surface, wherein said body is a unitary semiconductor wafer including a plurality of semiconductor chips; and
   (b) flexible leads having pad ends and tip ends, said pad ends of said flexible leads being connected to said pads, said tip ends of at least some of said flexible leads projecting over said front surface of said body, at least some of said flexible leads being spaced apart from said front surface, said tip ends of said flexible leads being independently movable with respect to said body, each of said at least some of said flexible leads being curved in a plane parallel to said front surface of said body;
   wherein each said semiconductor chip comprises a central region and a peripheral region surrounding said central region and wherein at least some of said pads are disposed in said peripheral region of each said semiconductor chip, said tip ends of said at least some of said flexible leads extending inwardly over said central region of each said semiconductor chip.

2. A microelectronic element as claimed in claim 1 wherein said flexible leads have a main portion disposed between said pad end and said tip end, said main portion having a width transverse to its direction of elongation that is smaller than a width of said pad end and a width of said tip end, and said flexible leads further have a gradually tapering section connecting said main portion with said pad end and a further gradually tapering section connecting said main portion with said tip end.

3. A microelectronic element comprising:
   (a) a body defining a front surface, said body having pads exposed at said front surface, wherein said body is a wafer probe card; and
   (b) flexible leads having pad ends and tip ends, said pad ends of said flexible leads being connected to said pads, said tip ends of at least some of said flexible bade projecting over said front surface of said body, at least some of said flexible leads being spaced apart from said front surface, said tip ends of said flexible leads being independently movable with respect to said body, each of said at least some of said flexible leads being curved in a plane parallel to said front surface of said body.

4. A microelectronic element as claimed in claim 3 wherein said flexible leads have a main portion disposed between said pad end and said tip end, said main portion having a width transverse to its direction of elongation that is smaller than a width of said pad end and a width of said tip end, and said flexible leads further have a gradually tapering section connecting said main portion with said pad end and a further gradually tapering section connecting said main portion with said tip end.

5. A microelectronic element comprising:
   (a) a body defining a front surface and including at least one semiconductor chip, said semiconductor chip having pads exposed at said front surface;
   (b) flexible leads having pad ends and tip ends, said pad ends of said flexible leads being connected to said pads, said tip ends of at least some of said flexible leads projecting over said front surface of said body, at least some of said flexible leads being spaced apart from said front surface, said tip ends of said flexible leads being independently movable with respect to said body, each of said at least some of said flexible leads including an elongated, strip-like main region having substantially flat main surfaces, a first main surface facing toward said body, a second main surface facing away from said body, each said elongated, strip-like main region having a first portion spaced apart from said front surface by a first distance and a second portion spaced apart from said front surface by a second distance, said first distance being greater than said second distance at least when said flexible leads are free standing, said first portion comprising said tip end and said second portion comprising said pad end; and (c) a compliant encapsulant filling the space between at least one of said flexible leads and said front surface of said body.

6. A microelectronic element as claimed in claim 5 wherein said compliant encapsulant comprises an elastomer.

7. A microelectronic element as claimed in claim 5 wherein said semiconductor chip comprises a central region and a peripheral region surrounding said central region and wherein at least some of said pads are disposed in said peripheral region of each said semiconductor chip, said tip ends of said at least some of said flexible leads extending inwardly over said central region of each said semiconductor chip.

8. A microelectronic element as claimed in claim 7 wherein said body is a unitary semiconductor wafer including a plurality of said semiconductor chips.

9. A microelectronic element, comprising:

(a) a body defining a front surface and including at least one semiconductor chip, said semiconductor chip having pads exposed at said front surface;

(b) flexible leads having pad ends and tip ends, said pad ends of said flexible leads being connected to said pads, said tip ends of at least some of said flexible leads projecting over said front surface of said body, at least some of said flexible leads being spaced apart from said front surface, said tip ends of said flexible leads being independently movable with respect to said body, each of said at least some of said flexible leads including an elongated, strip-like main region having substantially flat main surface, a first main surface facing toward said body, a second main surface facing away from said body, each said elongated, strip-like main region having a first portion spaced apart from said front surface by a first distance and a second portion spaced apart from said front surface by a second distance, said first distance being greater than said second distance at least when said flexible leads are free standing, said first portion comprising said tip end and said second portion comprising said pad end; and (c) a compliant encapsulant disposed between at least one of said flexible leads and said front surface of said body, wherein said compliant encapsulant comprises a gel.

* * * * *

UNITED STATES PATENT AND TRADEMARK OFFICE
CERTIFICATE OF CORRECTION

PATENT NO. : 6,906,422 B2
DATED : June 14, 2005
INVENTOR(S) : Joseph Fjelstad

It is certified that error appears in the above-identified patent and that said Letters Patent is hereby corrected as shown below:

Column 1,
Line 59, "packages" should read -- package --.
Line 61, delete "provide" after "packages".

Column 3,
Line 61, "FIG" should read -- FIGS --.

Column 4,
Line 32, "a" should read -- an --.
Line 35, "is" should read -- in --.

Column 5,
Line 25, "such a" should read -- such as --.

Column 7,
Line 64, "fanout" should read -- fan-out --.

Column 8,
Line 59, insert a comma between "sub-layer" and "is".
Line 65, delete "are".

Column 10,
Line 28, "bade" should read -- leads --.

Column 12,
Line 7, "flat main surface" should read -- flat main surfaces --.

Signed and Sealed this

Thirtieth Day of August, 2005

JON W. DUDAS
*Director of the United States Patent and Trademark Office*